United States Patent
El-Kady et al.

(10) Patent No.: US 11,424,400 B1
(45) Date of Patent: Aug. 23, 2022

(54) SUPERCONDUCTIVITY DEVICE COMPRISING A PHONONIC CRYSTAL

(71) Applicant: National Technology & Engineering Solutions of Sandia, LLC, Albuquerque, NM (US)

(72) Inventors: Ihab Fathy El-Kady, Albuquerque, NM (US); Rupert M. Lewis, Albuquerque, NM (US); Michael David Henry, Albuquerque, NM (US); Matt Eichenfield, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 797 days.

(21) Appl. No.: 16/294,011

(22) Filed: Mar. 6, 2019

Related U.S. Application Data

(60) Provisional application No. 62/639,362, filed on Mar. 6, 2018.

(51) Int. Cl.
| | |
|---|---|
| *H01L 39/12* | (2006.01) |
| *H01L 39/22* | (2006.01) |
| *G06N 10/00* | (2022.01) |
| *H01L 39/16* | (2006.01) |

(52) U.S. Cl.
CPC ............ *H01L 39/12* (2013.01); *G06N 10/00* (2019.01); *H01L 39/16* (2013.01); *H01L 39/223* (2013.01)

(58) Field of Classification Search
CPC ....... H01L 39/12; H01L 39/16; H01L 39/223; G06N 10/00
See application file for complete search history.

(56) References Cited

U.S. PATENT DOCUMENTS

| 10,439,125 B2 * | 10/2019 | Allan | .................. H01L 39/24 |
| 10,989,604 B1 * | 4/2021 | Denis | .................. H01L 39/14 |

OTHER PUBLICATIONS

Rostem et al., "Enhanced quasiparticle lifetime in a superconductor by selective blocking of recombination phonons with a phononic crystal," arXiv:1805.06991v2 (Year: 2018).*

* cited by examiner

*Primary Examiner* — Matthew L Reames
(74) *Attorney, Agent, or Firm* — Kevin W. Bieg

(57) ABSTRACT

The invention is directed to a device and method to engineer the superconducting transition width by suppressing the phonon populations responsible for the Cooper-pair decoherence below the superconducting transition temperature via phononic bandgap engineering. The device uses phononic crystals to engineer a phononic frequency gap that suppresses the decohering thermal phonon population just below the Cooper-frequency, and thus the normal conduction electron population. For example, such engineering can relax the cooling requirements for a variety of circuits yielding higher operational quality factors for superconducting electronics and interconnects.

10 Claims, 6 Drawing Sheets

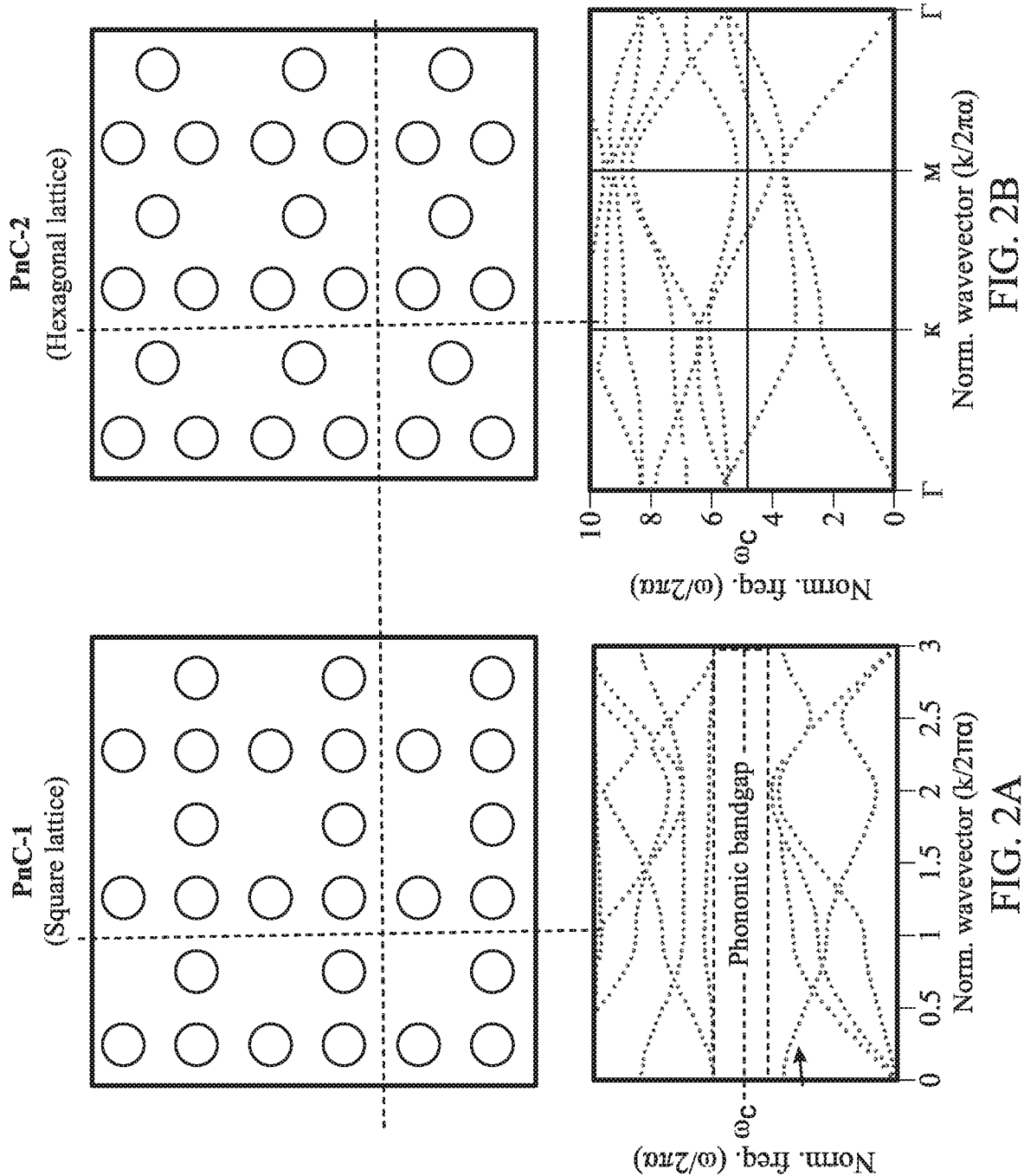

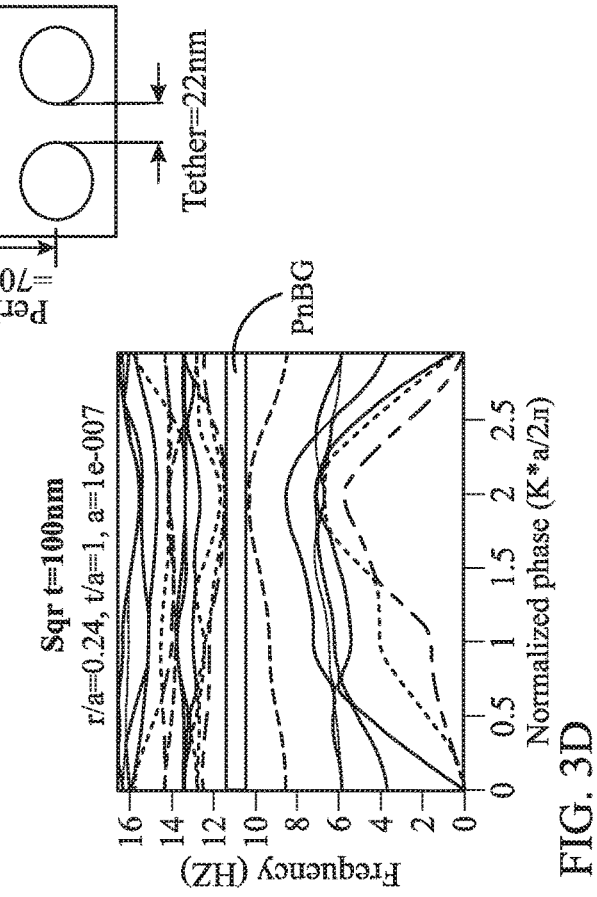
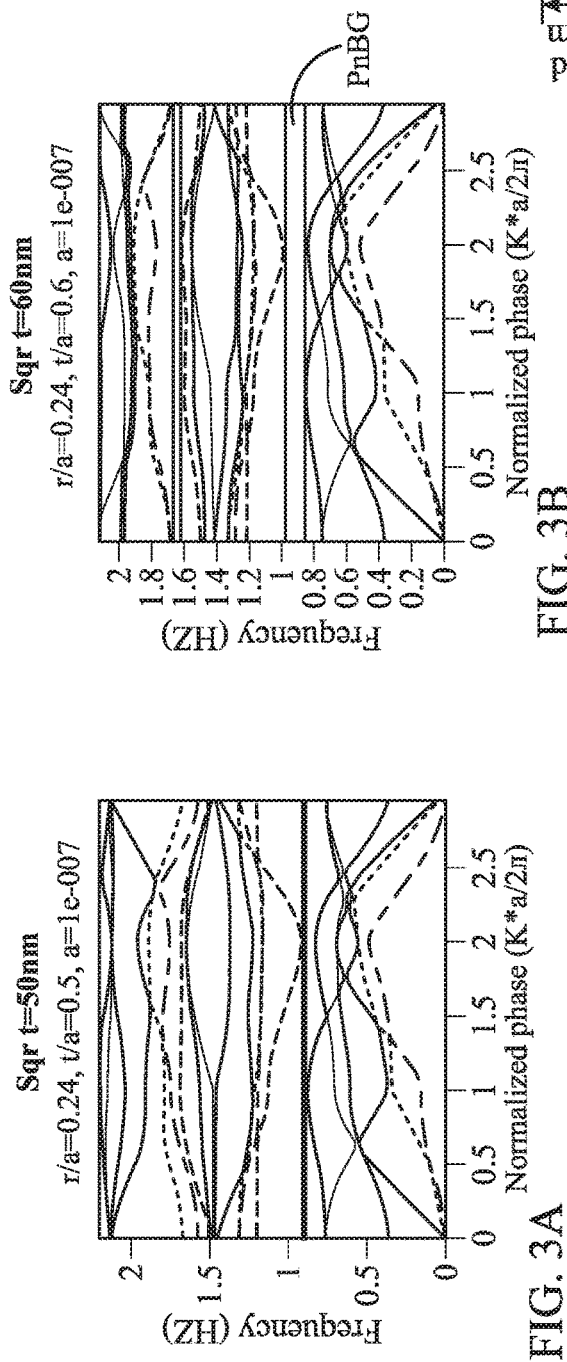
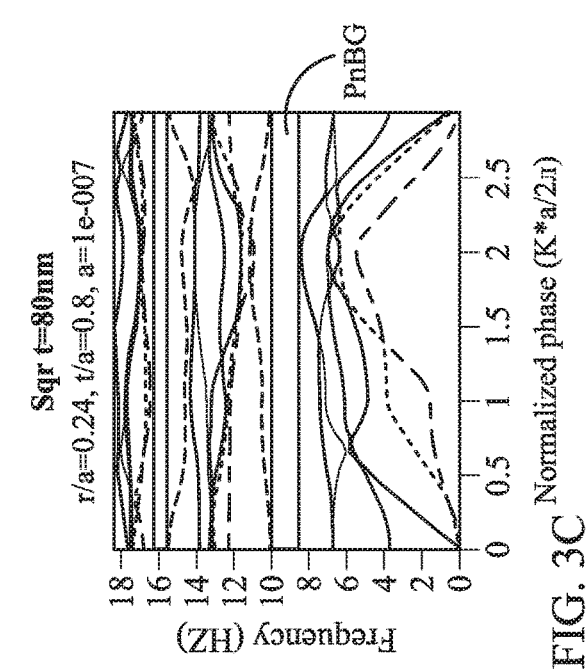
FIG. 3A  FIG. 3B  FIG. 3C  FIG. 3D

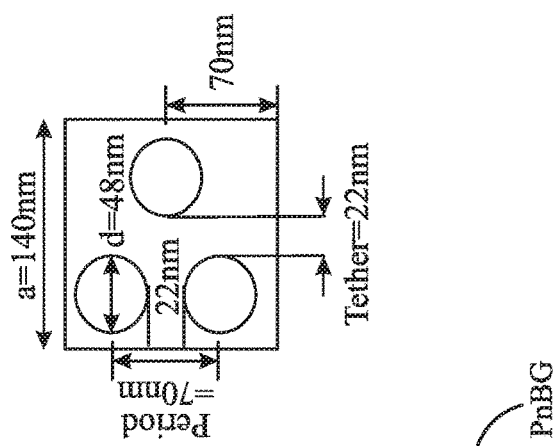
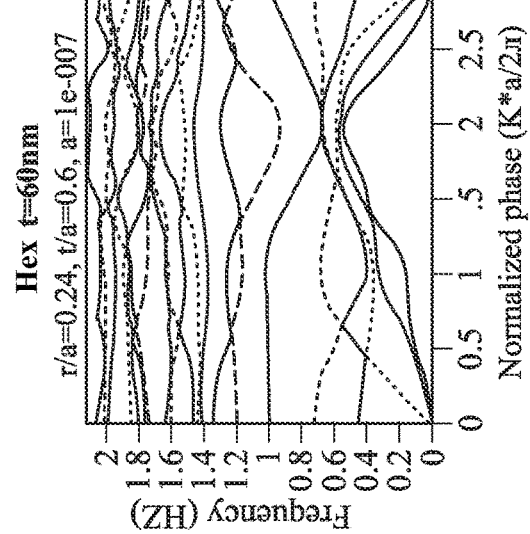
FIG. 3E
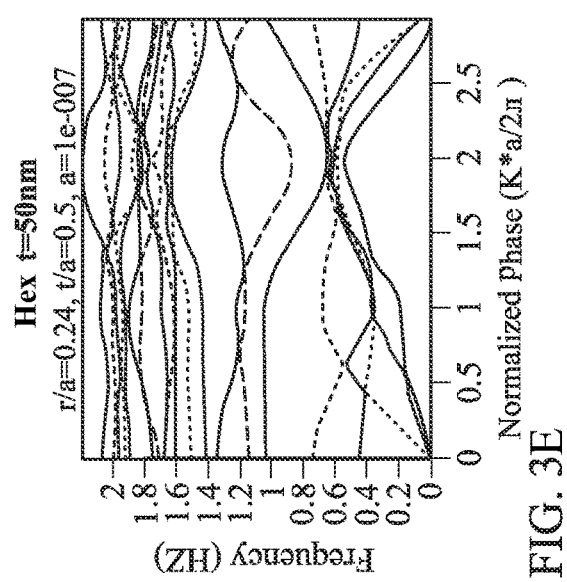
FIG. 3F
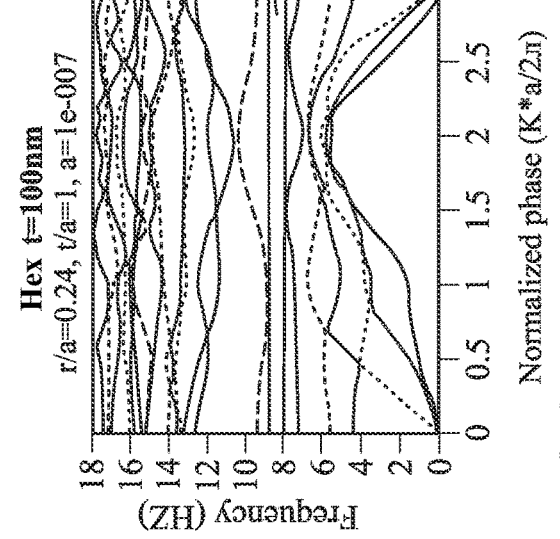
FIG. 3G
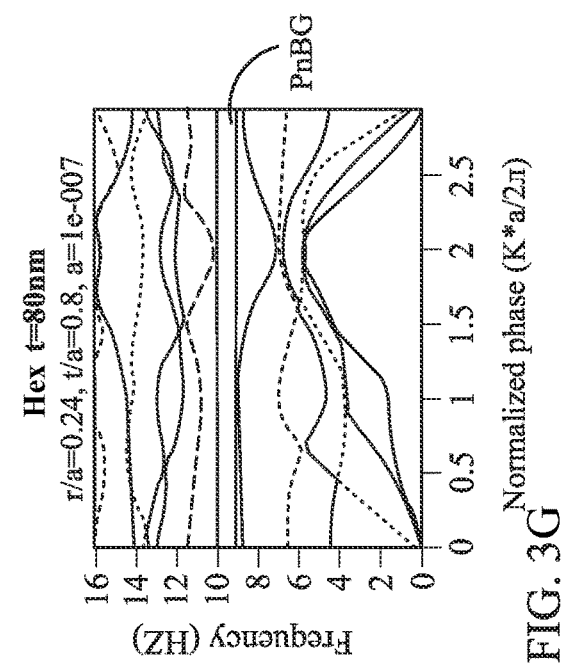
FIG. 3H

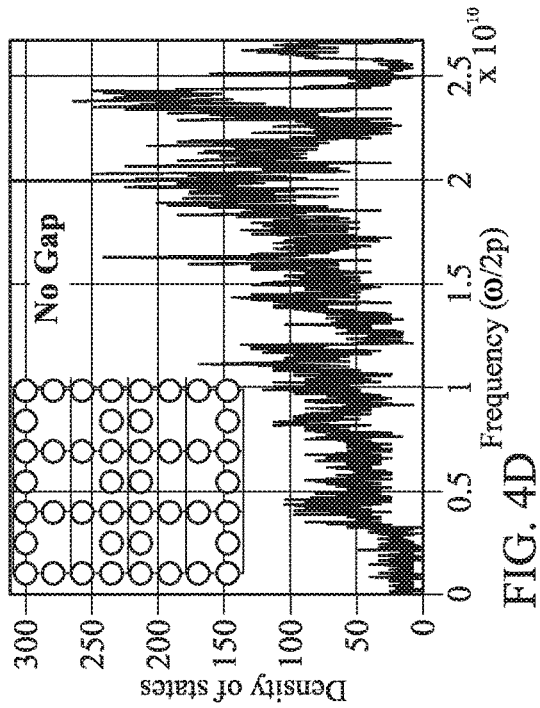
FIG. 4D
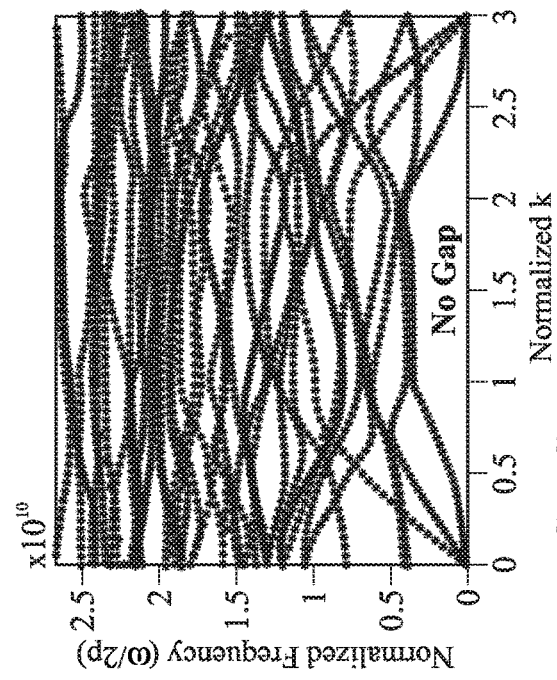
FIG. 4C
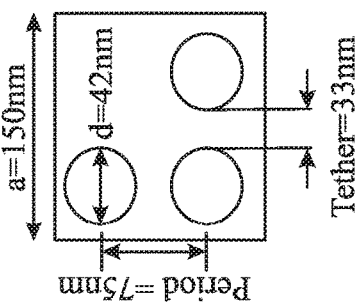
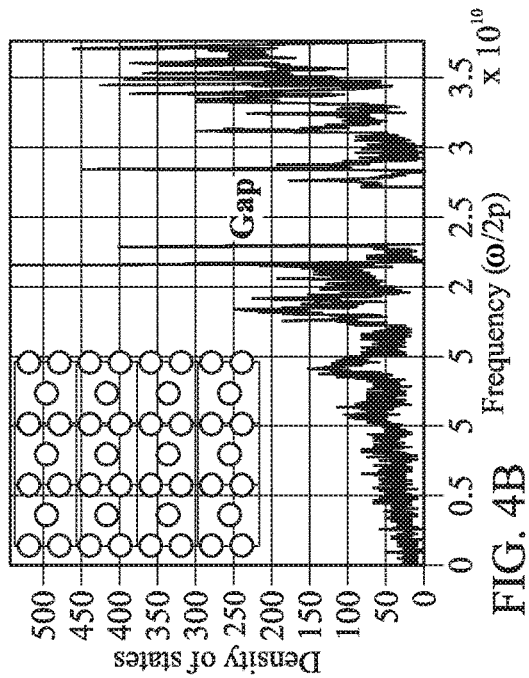
FIG. 4B
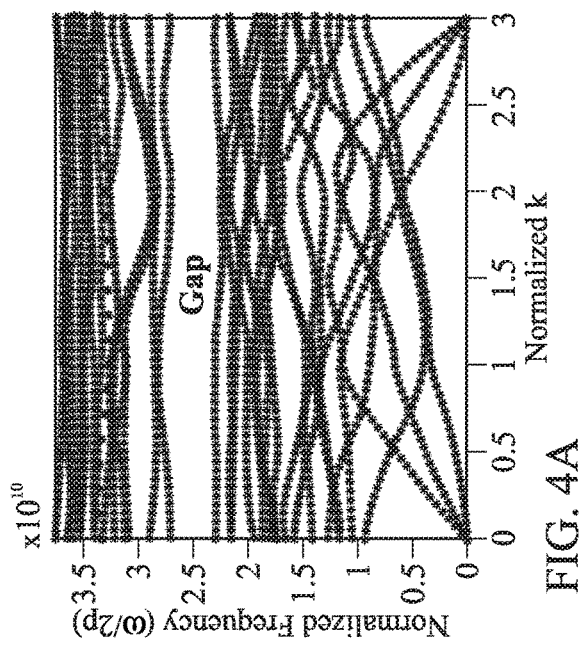
FIG. 4A

SUPERCONDUCTIVITY DEVICE COMPRISING A PHONONIC CRYSTAL

CROSS-REFERENCE TO RELATED APPLICATION

This application claims the benefit of U.S. Provisional Application No. 62/639,362, filed Mar. 6, 2018, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to superconductivity and, in particular, to a superconducting device and a method to engineer superconductivity using a phononic crystal.

BACKGROUND OF THE INVENTION

According to BCS theory, superconductivity arises from the creation of Cooper-pairs, a coherent interaction of two opposite-spin electrons coupled by a lattice phonon. As the temperature rises, approaching the transition temperature ($T_c$), interactions with thermal phonons result in Cooper-pair decoherence and loss of superconductivity. Thus, there exists two electron populations in a superconductor: superconducting Cooper-pairs and unpaired, normal-conducting electrons. In the neighborhood of $T_c$, resistive losses start increasing due to the increase in the thermal phonon noise and the subsequent disruption of the Cooper-pairs. As such, almost all superconducting applications require cooling well below $T_c$ to ensure a lossless system, which increases the required overhead in terms of cost and time. The ability to narrow the transition width $\Delta T_c$, as shown in FIG. 1A, would result in relaxing the cooling requirements, thereby enabling higher quality factors for superconducting resonators, transmission lines, and detectors, and potentially enhancing the sensitivity and reducing the dead-time of transition-edge single photon detectors.

As shown in FIG. 1B, in the two-fluid model of superconductivity by Casimir and Gorter, the ratio of superconducting electrons to normal conducting electrons is given by:

$$\frac{n_s}{N} = 1 - \left(\frac{T}{T_C}\right)^\gamma,$$

where $n_s$ is the number of superconducting electrons, $n_e$ is the number of normal conducting electrons, $N=n_s+n_e$ is the total number of electrons, and $\gamma \sim 4$, based on experiment. This equation suggests that the order parameter $\gamma$ can be engineered by controlling the phonon population. Further, the population of "Cooper-pairs" can be changed by manipulating the "Cooper phonons" that couple the electron pairs.

SUMMARY OF THE INVENTION

According to the present invention, the superconducting transition width can be engineered by suppressing the phonon populations responsible for the Cooper-pair decoherence below the superconducting transition temperature ($T_c$) via phononic bandgap engineering. The invention is directed to a superconducting device comprising a two-dimensional phononic crystal (PnC) comprising a periodic array of holes or plugs in a superconducting matrix material, wherein the holes or plug material provide an acoustic impedance mismatch with the matrix material, wherein the matrix material has a superconducting transition temperature $T_c$, and wherein the phononic crystal has a phononic bandgap at a frequency that suppresses a decohering thermal phonon population just below the Cooper-frequency of the matrix material, thereby suppressing the normal conduction electron population near $T_c$ and narrowing the width of the superconducting transition.

BRIEF DESCRIPTION OF THE DRAWINGS

The detailed description will refer to the following drawings, wherein like elements are referred to by like numbers.

FIGS. 2A and 2B are graphs of the band structure of two phononic crystal designs comprising air holes in an aluminum slab or plate. The two designs have identical hole sizes and number but arranged in different lattices. PnC-1 has a square lattice. PnC-2 has a hexagonal lattice.

FIGS. 3A-H are graphs of band structure calculations for the two different PnCs comprising air holes in a tantalum matrix. FIGS. 3A-D show band structure calculations for a square lattice with slab thicknesses from 50 to 100 nm. FIGS. 3E-H show band structure calculations for a hexagonal lattice with slab thicknesses from 50 to 100 nm.

FIGS. 4A and 4B are graphs of the calculated band structures, along with the corresponding density of phonon states, for a PnC with a hexagonal lattice. FIGS. 4C and 4D are graphs of the calculated band structures, along with the corresponding density of phonon states, for a PnC with a square lattice.

DETAILED DESCRIPTION OF THE INVENTION

Figure 1A:
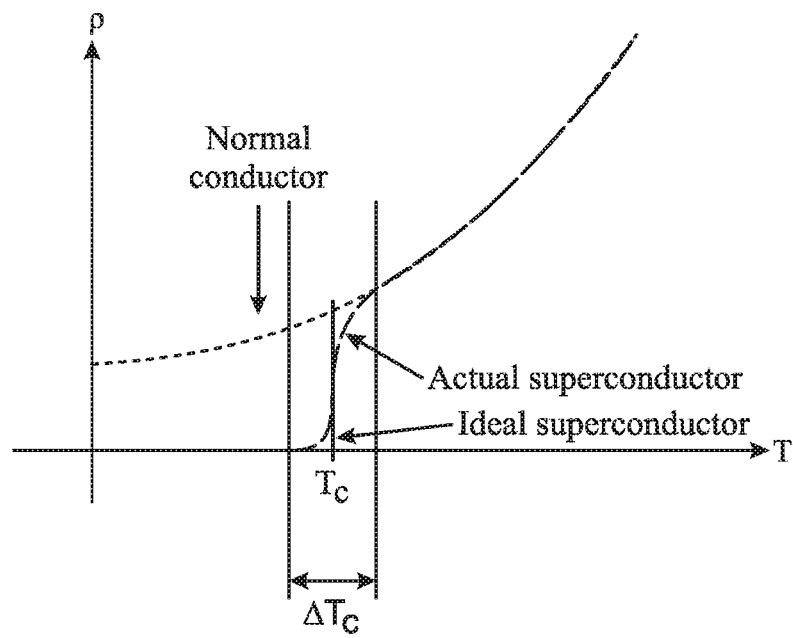
FIG. 1A is a graph of resistivity $\rho$ verses temperature T. The short-dashed line indicates the resistivity of a normal conductor, the solid line indicates the resistivity of an ideal superconductor, and the long-dashed fine indicates the resistivity of an actual conductor. Near $T_c$, an actual superconductor transitions from no resistivity to normal resistivity over a transition width, $\Delta T_c$.
Figure 1B:
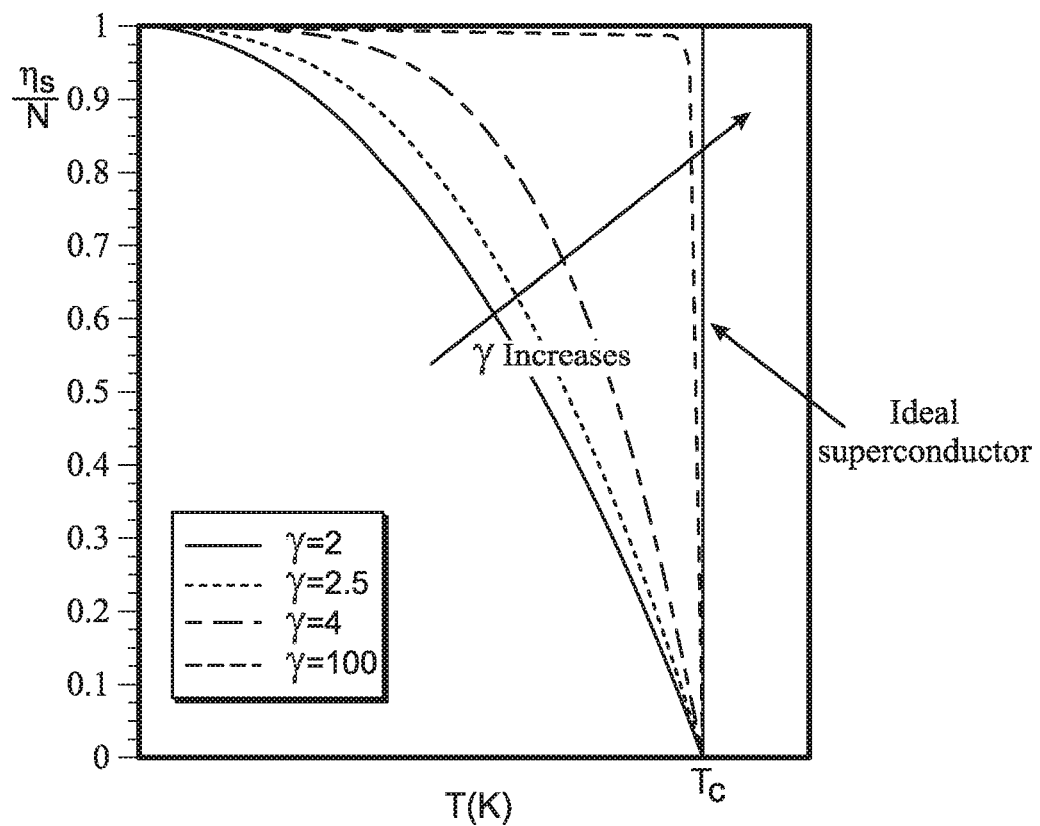
FIG. 1B is a graph of the fraction of superconducting electrons $n_s/N$ versus temperature T for a number of $\gamma$.

According to the present invention, the distribution of superconducting Cooper-pairs and unpaired normal-conducting electrons can be modified by selectively engineering which phonons can propagate in the superconductor. Changing the thermal background seen by the electrons can result in fewer quasi-particle excitations (i.e., normal electrons). Fundamentally, this phonon engineering route requires suppression of the phonon heat capacity of the superconductor near $T_c$. In particular, a phononic crystal (PnC) can be used to engineer a phononic frequency gap that suppresses the decohering thermal phonon population just below the Cooper-frequency ($f_c$), and thus the normal conduction electron population. PnCs comprise periodic arrangements of phonon scattering centers embedded in a homogeneous background matrix with lattice spacing comparable to the acoustic wavelength. The scattering material has a density and/or elastic constant that is different than the matrix material. When properly designed, a superposition of Bragg and Mie resonant scattering results in the opening of a frequency gap over which there can be no propagation of elastic waves in the crystal, regardless of direction. This property makes PnCs particularly attractive for their ability to manipulate and control phonon propagation.

The Cooper-frequency is related to the energy needed to break a Cooper-pair. Specifically, the Cooper-frequency is related to the energy gap of the superconductor by $$f_c * h = \Delta$$

where $f_c$ is the frequency of phonons, h is the Planck constant, and $\Delta$ is the superconducting energy gap of the matrix material. For example, the superconducting transition temperature for aluminum is $T_c$~1.25 K. The energy gap is about 190 μV at temperatures well below the transition temperature, giving a Cooper-frequency of about 46 GHz. The PnC can be designed to have a phononic bandgap at the Cooper-frequency of the matrix material, thereby suppressing the normal conduction electron population near the transition temperature and narrowing the width of the superconducting transition.

The present invention phononically engineers the superconducting state. By doing so, a sharp superconducting transition at $T_c$ can be achieved. By reducing or eliminating the transition tail, it can be possible to operate closer to $T_c$, hence relaxing the cooling requirements. Further, by suppressing the phonon heat capacity, it may be possible to achieve higher intrinsic quality factors (Q) for superconducting devices and single phonon sensitivity. To achieve these objectives requires tight fabrication tolerances, low temperature facilities for cooling and measurement, and the ability to deposit and micromachine high-quality superconducting films.

If the superconducting matrix material is dense and has a high velocity of sound, gas or vacuum provide a good acoustic impedance mismatch to the matrix material (e.g., vacuum has no density or sound velocity). As an example of the invention, the two-dimensional PnC can comprise air-holes in a metallic matrix. To demonstrate the ability of the present invention to control the superconducting transition via phononic engineering, two phononic crystals (PnC-1 and PnC-2) are compared conceptually using identical hole sizes and filling fraction, differing only in the geometric arrangement of the holes. Therefore, PnC-1 can be designed to have a phononic bandgap that encompasses the Cooper-frequency; while PnC-2 can be designed to not have a phononic bandgap at all. Since the two PnCs are identical in everything but their geometry and can be fabricated using the same process and on the same material slab, then the loss of the superconductivity in one PnC but not the other PnC can only be attributed to phonon engineering.

FIGS. 2A and 2B are schematic illustrations of two exemplary PnCs comprising two-dimensional periodic arrays of circular air holes in an aluminum slab or plate, along with their calculated band structures. The band structures are calculated accounting for the thickness of the PnC slab, and hence the gap is not perturbed by any surface states. PnC-1, shown in FIG. 2A, has a square lattice structure. This PnC has a phononic bandgap centered as the Cooper-frequency (shown as $\omega_c$). PnC-2, shown in FIG. 2B, has a hexagonal lattice structure. This PnC does not have a phononic bandgap. In this example, the superconducting transition is suppressed only in PnC-1 while it persists in PnC-2

A variety of low-temperature superconducting materials can be used as the matrix material. For example, superconducting metals (i.e., Type I or "BCS" superconductors) can be used as the matrix material, including aluminum (Al), tantalum (Ta), iridium (Ir), niobium (Nb), titanium (Ti), palladium (Pd), indium (In), tin (Sn), lead (Pb), vanadium (V), and alloys thereof. Other superconducting materials (i.e., Type II superconductors) can also be used, such as niobium compounds (e.g., NbN, NbTi, or NbTiN), vanadium compounds (e.g., $V_3Si$), and germanium compounds. For very low-temperature superconducting materials, the cell size can be up to about 300 nm (since the Cooper-pair wavelength and, therefore, the PnC cell size is inversely proportional to $T_c$). The thickness of the two-dimensional PnC slab, or plate, can be comparable or less than the cell size. The PnC slab can be supported by a thin membrane or substrate that is insulating and has a good acoustic impedance mismatch with the matrix material.

FIGS. 3A-D and 3E-H show the computational outcomes for tantalum as a matrix metal, for both square and hexagonal lattices, respectively. As can be seen, gaps can be designed for one PnC and gaps can be avoided in the other PnC, both having the same unit cell size (140 nm) and slab thickness t (e.g., compare PnCs with t=60 nm in FIGS. 3B and 3F). Furthermore, the gaps can be tuned and moved away from the Cooper-frequency in one PnC and centered at the correct frequency in the other (e.g., compare PnCs with t=100 nm in FIGS. 3D and 3H). The two PnCs can be fabricated using E-beam writes followed by etch chemistry. The tether size (neck between the air holes) is about 22 nm for these PnCs. This small tether can make fabrication difficult. The process can be modified to relax the dimensions of the PnC lattice to more readily fabricable sizes.

As another example of the invention, the PnCs can comprise solid plugs in a superconducting matrix. If the matrix material is light and/or has a low sound velocity, the plugs need to be dense and have a high sound velocity. Specifically, the plug material needs to have a high enough acoustic impedance mismatch with respect to the superconducting matrix material so that phonons in the matrix material are reflecting strongly by the solid plugs to allow for a phononic bandgap to be opened. Therefore, the plug material can be a metal or a non-metal having a good acoustic mismatch with the matrix material. Further, it is preferable to use a matrix material with low $T_c$, to allow for PnC features to be larger in size, but still avoid the need for dilution refrigeration. The plug material also should be normal conducting at the $T_c$ of the matrix material.

For this example, the PnC can be fabricated out of tungsten (W) plugs in an aluminum (Al) matrix. Tungsten is dense and has a high sound velocity and, therefore, provides a strong acoustic impedance mismatch with the lighter Al matrix. The transition temperature for Al is $T_c$~1.25 K. Tungsten has a $T_c$ of 1.5 mK, thus W will not be superconducting when the Al transition temperature is realized. This avoids the problem of carrier hopping between superconducting plugs. FIG. 4A shows the calculated band structure of a hexagonal lattice PnC, and FIG. 3B shows the corresponding density of phonon states. This PnC has a bandgap. FIGS. 4C and 4D show the calculated band structure and corresponding density of phonon states for a square lattice PnC. This PnC does not display a phononic bandgap. As can be seen the tether size of this PnC is a more manageable dimension of 33 nm.

Figures 5A, 5B:
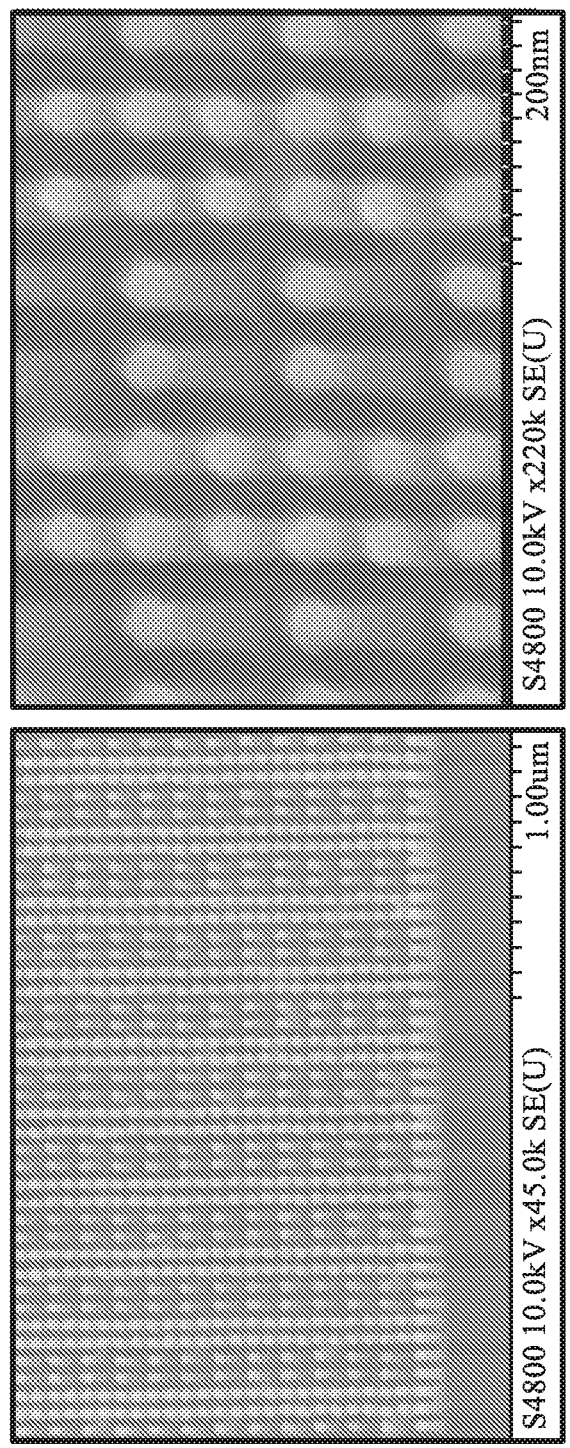
FIGS. 5A and 5B are scanning electron micrographs of e-beam write fabrications of a square lattice of silicon pillars at low and high magnification. The fabrications comprise 42 nm diameter, 140 nm tall silicon pillars on a period of 75 nm and a unit cell of 150 nm.

The fabrication process for these PnCs can comprise the following steps:
1. E-beam write photoresist on a silicon substrate
2. Use resist as etch mask
3. Etch away, leaving Si pillars
4. Sputter/vapor deposit Al film on the Si pillars
5. Etch away Si leaving holes in the Al film
6. Back-fill the holes with tungsten FIGS. 5A and 5B show the result of an E-beam write and etching to form Si pillars (step 3), prior to Al deposition, Si etching, and W backfill (steps 4-6).

The invention can greatly improve superconducting electronics for high performance computing at the heart of current encryption and secure communications. The invention may enable more tunable parameters for detection and sensing technology and the reliable detection at the single quanta. The invention may also enable quantum computing which holds the future of secure communication. The reduction of the superconducting transition width may enable higher quality factor (Q) superconducting circuits, transmission lines, and resonators. The invention can greatly relax the cooling requirements necessary for superconducting operations.

For example, the invention can provide a highly sensitive transition edge single photon detector (SPD) in a PnC. A PnC film can be placed on top of an optical wave guide. The PnC bandgap can be designed to encompass $f_c$. A serpentine line defect can then be created in the PnC such that it meanders over the waveguide. Thus, a superconducting state will exist only in the serpentine. By operating at the critical current density ($J_c$) of the serpentine, the absorption of a single photon can then be detected as a calorimetric change in the serpentine resistance. While the geometry and principal of operation is similar to the state-of-the-art superconducting nanowire SPD, the ability to dispose of the generated normal electron pairs through the PnC normal conducting region rather than forcing them to propagate through a lengthy serpentine reduces detector dead-time while maintaining photon number resolution and detection efficiency.

The present invention has been described as a superconducting device and method to engineer superconductivity using phononic crystals. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A superconducting device, comprising:
a two-dimensional phononic crystal comprising a periodic array of holes or plugs in a superconducting matrix material, wherein the holes or plug material provide an acoustic impedance mismatch with the matrix material, wherein the matrix material has a superconducting transition temperature $T_c$, and wherein the phononic crystal has a phononic bandgap at a frequency that suppresses a decohering thermal phonon population just below the Cooper-frequency of the matrix material, thereby suppressing the normal conduction electron population near $T_c$ and narrowing the width of the superconducting transition.

2. The superconducting device of claim 1, wherein the superconducting transition temperature of the plug material is less than $T_c$.

3. The superconducting device of claim 1, wherein the plug material comprises a metal.

4. The superconducting device of claim 3, wherein the plug material comprises tungsten.

5. The superconducting device of claim 1, wherein the matrix material comprises a metal.

6. The superconducting device of claim 1, wherein the matrix material comprises aluminum, tantalum, iridium, tin, lead, niobium, titanium, palladium, indium, vanadium, or alloys thereof.

7. The superconducting device of claim 1, wherein the matrix material comprises a compound.

8. The superconducting device of claim 1, wherein the unit cell size of the phononic crystal is less than the acoustic wavelength of the Cooper-frequency of the matrix material.

9. The superconducting device of claim 1, wherein the unit cell size of the periodic array is less than 300 nm.

10. The superconducting device of claim 1, wherein the periodic array comprises a square or hexagonal lattice.

* * * * *